United States Patent [19]

Yoshida

[11] Patent Number: 5,306,941
[45] Date of Patent: Apr. 26, 1994

[54] SEMICONDUCTOR MEMORY DEVICE AND PRODUCTION PROCESS THEREOF

[75] Inventor: Norio Yoshida, Hyogo, Japan

[73] Assignee: Ricoh Company, Ltd., Tokyo, Japan

[21] Appl. No.: 955,128

[22] Filed: Oct. 1, 1992

[30] Foreign Application Priority Data

Oct. 9, 1991 [JP] Japan .................. 3-292153

[51] Int. Cl.$^5$ .......................... H01L 29/78
[52] U.S. Cl. .................. 257/390; 257/391; 365/104
[58] Field of Search ........... 257/391, 315, 316, 390; 365/104

[56] References Cited

U.S. PATENT DOCUMENTS

| | | | |
|---|---|---|---|
| 4,663,644 | 5/1987 | Shimizu | 257/391 |
| 4,874,715 | 10/1989 | Paterson | 437/43 |
| 4,979,004 | 12/1990 | Esquivel et al. | 257/316 |
| 5,002,896 | 3/1991 | Naruke | 257/391 |
| 5,202,848 | 4/1993 | Nakagawara | 365/104 |

FOREIGN PATENT DOCUMENTS

1-53463  3/1989  Japan .................. 257/316

*Primary Examiner*—Jerome Jackson
*Assistant Examiner*—Courtney A. Bowers
*Attorney, Agent, or Firm*—Cooper & Dunham

[57] ABSTRACT

A semiconductor memory device is highly integrated by a combination of planer cell structure with the trench etching technique. Trenches are formed on a substrate in parallel with each other, and diffused layers are on sidewalls of the trenches to provide bit lines. Gates oxide layers are formed on the bottoms of trenches and on surfaces of the substrate between adjacent two trenches, and silicon oxide layers thicker than the gate oxide layers are on the bit lines. Word lines are formed in band in parallel with each other in a direction to cross the trenches perpendicularly thereto. Channel regions are defined in portions of word lines on the bottoms of trenches and on the surfaces of substrate crossed thereby. Ion implantation is conducted into each memory transistor according to data to determine a ROM code, to set a threshold value therein.

7 Claims, 4 Drawing Sheets

SEMICONDUCTOR MEMORY DEVICE AND PRODUCTION PROCESS THEREOF

BACKGROUND OF THE INVENTION

1. Field of the Invention

The present invention relates to a semiconductor memory device and a process for producing it. More particularly, the invention relates to a semiconductor memory device of mask ROM (read only memory) as so-called as a planer cell structure, and to a production process thereof.

2. Description of the Related Art

A common MOS (metal-oxide semiconductor) type semiconductor integrated circuit device is formed such that field oxide separates elements and that an impurity is introduced into a substrate in the self alignment technique with gate electrodes as a mask to form source and drain regions. Such a circuit device requires one or two contacts of the source and drain regions for one transistor, so that contact margins and a wiring pitch may affect a degree of integration in circuit. To avoid that, there is a semiconductor integrated circuit device as so-called as a planer cell structure proposed for example in Japanese Patent Application Laying Open (KOKAI) Nos. 61-288464 and 63-96953.

FIGS. 1 and 2 show the planer cell structure. In the planer cell structure, continuous diffused regions 2s for source regions of memory transistor and continuous diffused regions 2d for drain regions of memory transistor are formed in parallel with each other on a substrate 1, and word lines (gate electrodes) 4 are formed to cross the both diffused regions 2s and 2d with an insulating layer 3 intervening between them on the substrate 1. The planer cell structure needs no field oxide for element separation. Further, a plurality of memory transistors share a source region 2s and a drain region 2d. Thus, a contact is enough for several to several ten's memory transistors, which is advantageous for high integration design. A size of memory cell in the planer cell structure is determined by a pitch of the diffused regions 2s, 2d for the source and drain regions, and by a pitch of the word lines 4.

There are needs in the market for more high density and integration not only in semiconductor memory devices but also in all semiconductor integrated circuit devices. To make a memory cell array of planer cell structure finer, it is necessary to reduce the pitches of the diffused regions 2s, 2d and of the words lines 4. The pitches depend upon the performance of processing apparatuses. The smallest pitch is 2 μm with the processing apparatuses presently available in mass production level.

If a finer planer cell structure should be sought for, the short channel effect restricts the reduction in pitch in the diffused layers 2s, 2d. The short channel effect may be avoided by employing diffused layers of LDD (lightly doped drain) structure in common MOS transistors such as a peripheral transistor. The planer cell structure cannot be, however, suitable for use of the LDD structure because of the structural limitations thereof.

SUMMARY OF THE INVENTION

It is an object of the present invention to provide a semiconductor memory device further highly integrated in a combination of the planer cell structure with the trench etching technique, and to provide a method for producing it.

The object of the present invention can be achieved by a semiconductor memory device in which trenches are formed in parallel with each other on a silicon substrate, in which impurity diffused layers are formed on sidewalls of said trenches to provide bit lines, in which word lines serving as gate electrodes as well are formed in a direction to cross said trenches while insulated from said impurity diffused layers, and in which channel regions are defined on bottoms of the trenches and on surfaces of the substrate between adjacent two trenches under said word lines.

Further, the object of the invention can also be achieved by a process for producing a semiconductor memory device, comprising the following steps of: forming line trenches on a silicon substrate in parallel with each other; depositing silicon oxide containing an impurity of opposite type to said substrate thereon, then to remove said silicon oxide by etch back except that on said sidewalls of trenches; diffusing the impurity from the silicon oxide on the trench sidewalls to the substrate by a heat treatment to form bit lines; forming gate oxide layers on bottoms of the trenches and on surfaces of substrate between adjacent two trenches, and oxide layers thicker than the gate oxide layers on the bit lines by heat oxidation; and depositing a polycrystal silicon thereon and making a pattern of lines parallel to each other in a direction to cross the trenches to form word lines.

The formation of the bit lines on the sidewalls of trenches frees the flat surface on the substrate, which used to be occupied by the bit lines, to increase the degree of integration.

The depth of the trenches corresponds to the width of the bit lines. The deeper the trenches, the wider the bit lines, decreasing a resistance value thereof. Thus the bit lines may be reduced in resistance without expansion of area of element.

For further higher integration, a semiconductor memory device according to the present invention may be arranged such that trenches are formed in parallel with each other on a silicon substrate, that impurity diffused layers are formed on sidewalls of said trenches to provide bit lines, that word lines serving as gate electrodes as well are formed in a direction to cross said trenches while insulated from said impurity diffused layers, said word lines comprising word lines of polycrystal silicon in a first layer and in a second layer insulated from each other arranged in an alternate manner, and that channel regions are defined on bottoms of the trenches and on surfaces of the substrate between adjacent two trenches under said word lines.

The double layered word lines with the first and the second layers alternating utilize the almost entire region on the substrate in a plan view thereof as the channel regions, maximizing the degree of integration.

Further objects and advantages of the present invention will be apparent from the following description of the preferred embodiments of the invention as illustrated in the accompanying drawings.

BRIEF DESCRIPTION OF THE DRAWINGS

FIGS. 1 and 2 are drawings to show a conventional memory cell array of planer cell structure, in which FIG. 1 is a plan view thereof and FIG. 2 is a cross-sectional view thereof along II—II line;

FIGS. 3 and 4 are drawings to show an embodiment of a semiconductor memory device according to the present invention, in which FIG. 3 is a plan view thereof and FIG. 4 is a cross-sectional view thereof along IV—IV line;

DESCRIPTION OF THE PREFERRED EMBODIMENTS

Figure 1:
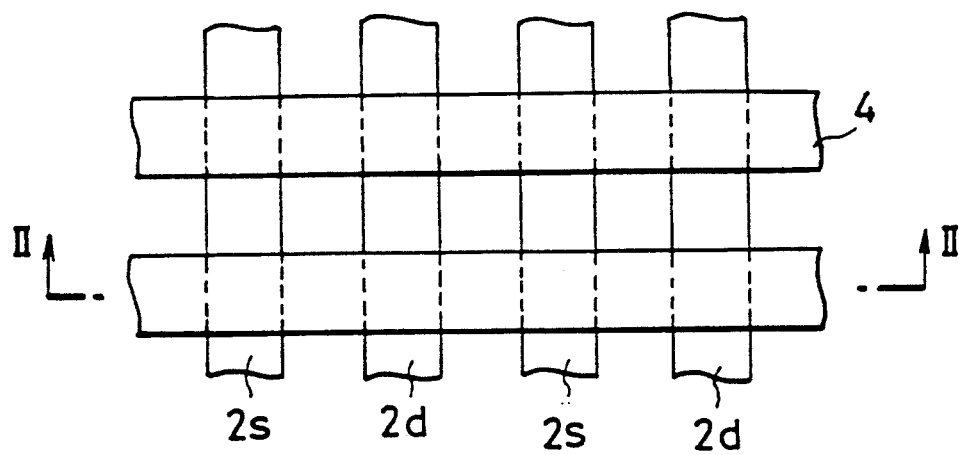
Figure 2:
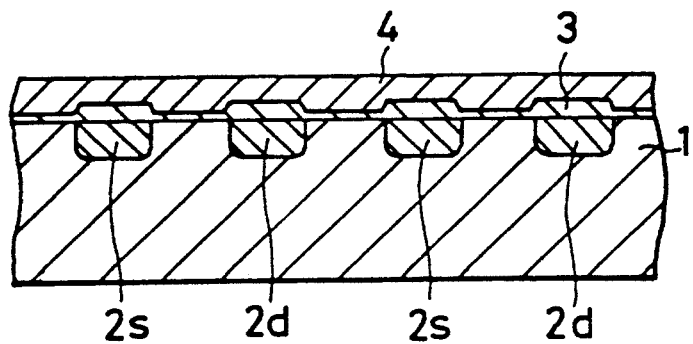
Figure 3:
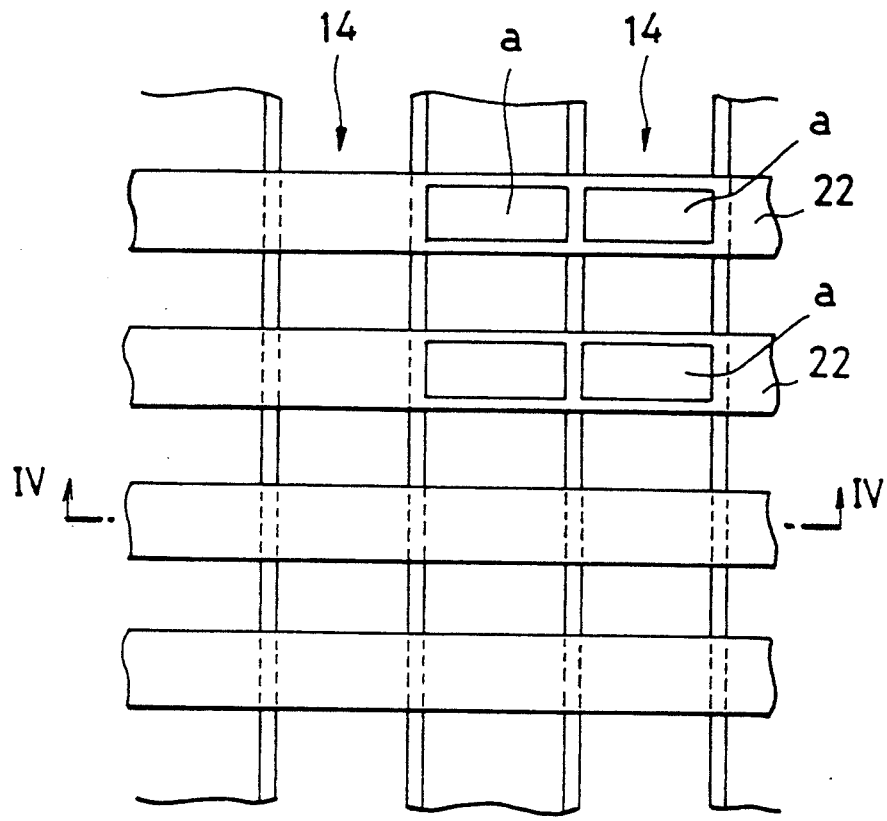
Figure 4:
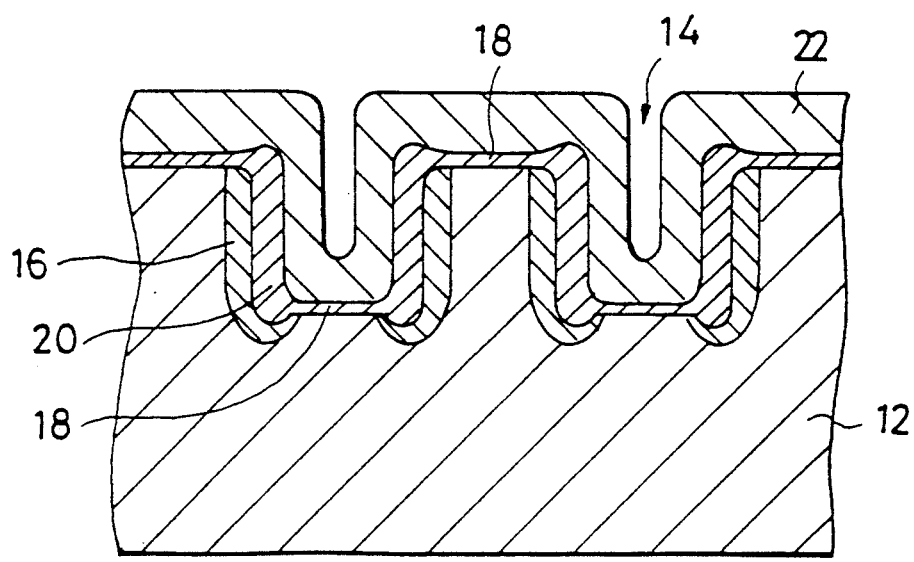
Figure 5A:
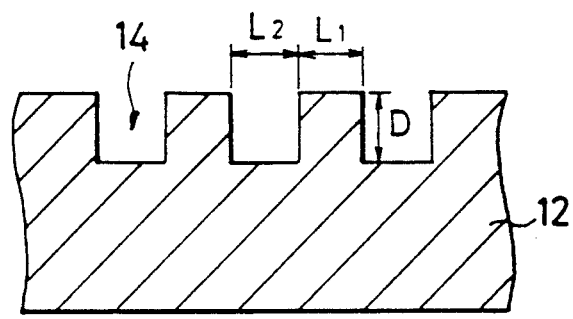
FIG. 5a-d is cross-sectional views of main steps to show an embodiment of a process for producing a semiconductor memory device according to the present invention.
Figure 5B:
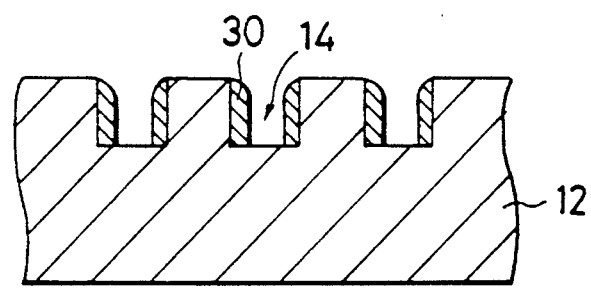
Figure 5C:
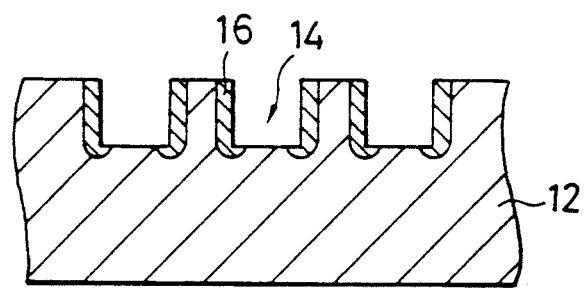
Figure 5D:
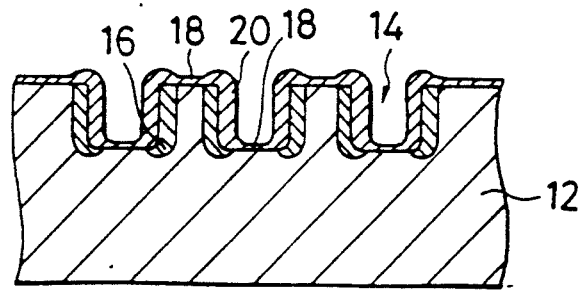

FIGS. 3 and 4 show a memory section of a semiconductor memory device in an embodiment according to the present invention. FIG. 3 is a plan view thereof and FIG. 4 is a cross-sectional view thereof along IV—IV line.

In FIGS. 3 and 4, numeral 12 denotes a silicon substrate of p type, on which a channel stopper layer and a field oxide layer are formed for separation between a peripheral transistor section and a memory section, though not shown. There are trenches 14 formed in parallel with each other on the substrate 12. Diffused layers 16 with an n type impurity are formed on sidewalls of the trenches 14, constituting bit lines extending in a direction of the trenches. Gate oxide layers 18 are formed on bottom faces of the trenches 14 and on substrate surfaces between the adjacent two trenches. Silicon oxide layers 20 thicker than the gate oxide layers 18 are formed on the bit lines 16.

Word lines 22 are formed in belt of polycrystal silicon in parallel with each other in a direction perpendicular to the direction of the trenches 14. The word lines 22 also serve as gate electrodes, and provide channel regions on the bottom faces of the trenches 14 and on the substrate surfaces which the word lines cross. Rectangular regions represented by a are the channel regions in FIG. 3. A channel region between two bit lines 16, 16 constitutes a memory transistor.

A threshold value is set for each memory transistor by ion implantation according to data to determine a ROM code. The ROM code is determined for example by implanting a p-type impurity such as boron into a channel region to increase a threshold value, and by implanting nothing to maintain a threshold value low.

A p type impurity such as boron is implanted for channel stopper on the bottom of the trenches 14 and the substrate surfaces between the trenches 14. Interlayer dielectric layers (not shown) such as a PSG (phospho-silicate glass) film are formed on the substrate 12 and on the word lines 22. Metal wires are connected through contact holes in the interlayer dielectric layers to the bit lines 16 and to the word lines 22.

Next explained with reference to FIG. 5 is an embodiment of a process for producing a semiconductor memory device according to the present invention. Although there are peripheral sections other than a memory section on a chip, the peripheral sections are omitted in FIG. 5, because they can be produced in conventional processes. The following explanation is focused mainly on steps to process the memory section.

(a) A channel stopper layer and a field oxide layer are formed on a p type silicon substrate 12 for separation between a memory section and peripheral transistor sections and between the peripheral transistors.

A resist pattern is formed on the substrate 12 by the photolithograph to form trenches thereon. Etching is conducted on the substrate 12 with the resist as a mask to form the trenches 14. Then the resist is removed. A depth D of the trenches 14 defines a width of the bit lines, for example of about 1.0 μm. A width $L_2$ of a trench 14 and a width $L_1$ of a substrate surface between two adjacent trenches define a channel length, which both are of about 1.0 μm.

(b) A PSG layer is deposited by a low temperature CVD (chemical vapor deposition) method below 400° C. After the deposition, the PSG layer is subject to the etch back, thereby leaving PSG layers 30 only on the sidewalls of the trenches.

(c) A high temperature thermal treatment (800° to 900° C.) is effected with the PSG layers 30 on the sidewalls of the trenches, so that phosphorus in the PSG layers 30 diffuses into the silicon substrate to form n type diffused layers 16 on the sidewalls of the trenches 14. The diffused layers 16 become bit lines.

(d) A thermal treatment is effected to form gate oxide layers. The thermal treatment makes gate oxide layers 18 with a thickness of 100 to 500 angstroms on the bottom faces of the trenches and on the substrate surfaces between the trenches, and thicker silicon oxide layers 20 with a thickness of 500 to 2000 angstroms on the n type diffused layers 16 by increased rate oxidation.

Then a p type impurity such as boron is implanted for control of threshold value of memory transistors. Conditions for the ion implantation are an energy of 10 to 50 KeV and an implantation amount of $10^{15}$ to $10^{17}$ ions/cm$^3$.

This ion implantation step for channel doping may be conducted after the formation of the trenches 14 and before the formation of the diffused layers 30, or alternatively thereafter before the formation of the gate oxide layers.

A polycrystal silicon layer or policide layer is formed for word lines in the memory section and for gate electrodes of the peripheral transistors. The photolithograph and the etching are carried out on the polycrystal silicon layer to form the word lines 14 and the gate electrodes of the peripheral transistors. An n type impurity such as arsenic is implanted into the peripheral transistors to form sources and drains.

A core implantation is conducted for data recording. The core implantation is an implantation of p type impurity such as boron with an implantation energy of 50 to 200 KeV and with an implantation amount of $10^{16}$ to $10^{20}$ ions/cm$^3$.

A p type impurity such as boron is implanted for channel stopper on the trench bottom faces and the substrate surfaces except the channel regions in the memory section.

After that, interlayer dielectric layers are formed, contact holes are then formed, metal wires are given, and a passivation protection film is formed by usual processes.

Figure 6:
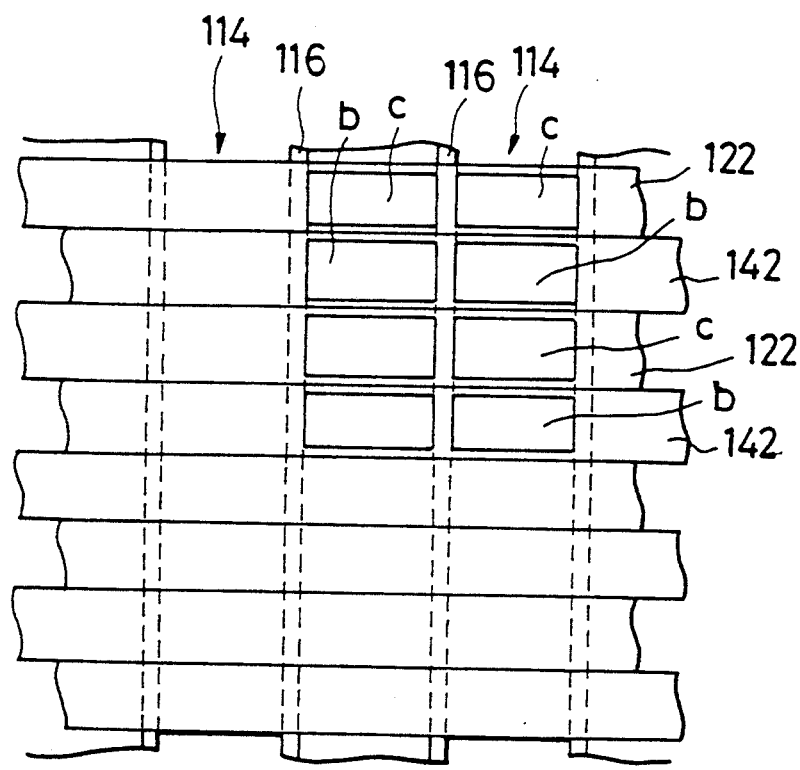
FIG. 6 is a plan view to show another embodiment of the semiconductor memory device according to the present invention.

FIG. 6 shows the second embodiment of the semiconductor memory device according to the present invention.

In the second embodiment of FIG. 6, a first layer of polycrystal silicon is patterned to form word lines 122 similarly as shown in FIGS. 3 and 4, a second layer of polycrystal silicon is given to form second word lines 142 between the word lines 122. Such double layered word lines have already been proposed by Inventors in Japanese Patent application No. 1-224789. An insulation layer provides insulation between the word lines 122 and the second word lines 142. Numeral 116 denotes bit lines and numeral 114 denotes trenches.

The structure of the double layered word lines and a production process thereof are substantially identical to those as described in above Japanese Patent application No. 1-224789, and therefore the details thereof are omitted to explain.

The double layered structure of the word lines as shown in FIG. 6 provides channel regions c in the first layer word lines 122 and channel regions b in the second layer word lines 142, utilizing the almost entire region on the substrate in the plan view thereof as channel regions.

As described above, the trenches are formed on the substrate and the bit lines are formed on the sidewalls of the trenches in the present invention. This arrangement requires no area of flat surface on the substrate for the bit lines, thereby increasing the degree of integration.

Further, the depth of the trenches corresponds to the width of the bit lines. Deeper trenches result in wider bit lines with reduced resistance value. This arrangement allows a reduction in resistance of the bit lines without increasing element area.

The double layered structure of the word lines with the first and second word lines alternating can utilize the almost entire region in the plan view as channel regions, maximizing the degree of integration.

Many widely different embodiment of the present invention may be constructed without departing from the spirit and scope of the present invention. It should be understood that the present invention is not limited to the specific embodiments described in the specification, except as defined in the appended claims.

What is claimed is:

1. A semiconductor memory device in which trenches are formed in parallel with each other on a silicon substrate, in which impurity diffused layers are formed on sidewalls of said trenches to provide bit lines, in which word lines serving as gate electrodes as well are formed in a direction to cross said trenches while insulated from said impurity diffused layers, and in which channel regions are defined on bottoms of the trenches and on surfaces of the substrate between adjacent trenches under said word lines.

2. A semiconductor memory device according to claim 1, wherein said trenches are formed by etching.

3. A semiconductor memory device according to claim 1, wherein said bit lines are formed on the sidewalls of trenches of 1.0 μm depth.

4. A semiconductor memory device according to claim 1, wherein ion implantation is carried out into said channel regions in accordance with a predetermined ROM code to set threshold levels therein.

5. A semiconductor memory device according to claim 1, wherein said word lines comprise first word lines arranged at a predetermined pitch in a first layer and second word lines arranged between adjacent two of said first word lines in a second layer.

6. A semiconductor memory device according to claim 5, wherein said first and second layers are of polycrystal silicon.

7. A semiconductor memory device in which trenches are formed in parallel with each other on a silicon substrate, in which impurity diffused layers are formed on sidewalls of said trenches to provide bit lines, in which word lines serving as gate electrodes as well are formed in a direction to cross said trenches while insulated from said impurity diffused layers, said word lines comprising word lines of polycrystal silicon in a first layer and in a second layer insulated from each other and arranged in an alternating manner, and in which channel regions are defined on bottoms of the trenches and on surfaces of the substrate between adjacent trenches under said word lines.

* * * * *